United States Patent
Kräuter et al.

(10) Patent No.: US 9,331,255 B2
(45) Date of Patent: May 3, 2016

(54) HOUSING THAT INCLUDES REFLECTOR PART AND HOUSING MATERIAL FORMED WITH PLASTIC MATERIAL

(75) Inventors: Gertrud Kräuter, Regensburg (DE); Bernd Barchmann, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 979 days.

(21) Appl. No.: 13/513,784

(22) PCT Filed: Nov. 17, 2010

(86) PCT No.: PCT/EP2010/067705
§ 371 (c)(1),
(2), (4) Date: Jul. 13, 2012

(87) PCT Pub. No.: WO2011/082876
PCT Pub. Date: Jul. 14, 2011

(65) Prior Publication Data
US 2012/0280116 A1    Nov. 8, 2012

(30) Foreign Application Priority Data
Dec. 16, 2009   (DE) .......................... 10 2009 058 421

(51) Int. Cl.
*H01L 21/00*  (2006.01)
*H01L 33/60*  (2010.01)
*H01L 33/48*  (2010.01)

(52) U.S. Cl.
CPC .............. *H01L 33/60* (2013.01); *H01L 33/486* (2013.01); *H01L 2224/32245* (2013.01); *H01L 2224/48091* (2013.01); *H01L 2224/48247* (2013.01); *H01L 2224/73265* (2013.01)

(58) Field of Classification Search
CPC ....... H01L 23/02; H01L 23/552; B29C 45/14; F21V 15/01; F21V 7/00
USPC ................... 438/125; 250/216, 226; 362/259; 264/1.9
See application file for complete search history.

(56) References Cited

U.S. PATENT DOCUMENTS

| | | | |
|---|---|---|---|
| 6,624,491 B2 | 9/2003 | Waitl et al. | |
| 6,680,490 B2 | 1/2004 | Yasukawa et al. | |
| 6,943,433 B2 * | 9/2005 | Kamada | 257/666 |
| 7,192,164 B2 * | 3/2007 | Matsuura | 362/296.05 |
| 8,029,152 B2 | 10/2011 | Sekine et al. | |
| 8,070,316 B2 * | 12/2011 | Urano et al. | 362/249.02 |

(Continued)

FOREIGN PATENT DOCUMENTS

| | | |
|---|---|---|
| DE | 199 45 133 A1 | 4/2001 |
| DE | 602 09 964 T2 | 11/2006 |

(Continued)

*Primary Examiner* — Caleb Henry
(74) *Attorney, Agent, or Firm* — Slater & Matsil, L.L.P.

(57) ABSTRACT

A method can be used to produce a housing for an optoelectronic semiconductor device. A reflector part, which has an inner area configured to reflect electromagnetic radiation, is encased in places with a housing material using an injection molding method. The inner area of the reflector part remains free of the housing material at least in places. The reflector part is formed with a first plastic material and the housing material is formed with a second plastic material that is different than the first plastic material. The first plastic material and the second plastic material differ from one another with regard to at least thermal stability or resistance to electromagnetic radiation.

20 Claims, 3 Drawing Sheets

(56) References Cited

U.S. PATENT DOCUMENTS

| | | | |
|---|---|---|---|
| 8,288,793 B2* | 10/2012 | Kim et al. | 257/99 |
| 9,086,211 B2* | 7/2015 | Duong et al. | |
| 2001/0022390 A1* | 9/2001 | Waitl et al. | 257/666 |
| 2002/0057571 A1* | 5/2002 | Osumi et al. | 362/298 |
| 2004/0046242 A1* | 3/2004 | Asakawa | 257/678 |
| 2004/0207999 A1* | 10/2004 | Suehiro et al. | 362/84 |
| 2004/0232435 A1 | 11/2004 | Hofer et al. | |
| 2006/0102917 A1 | 5/2006 | Oyama et al. | |
| 2006/0157722 A1 | 7/2006 | Takezawa et al. | |
| 2007/0019416 A1* | 1/2007 | Han et al. | 362/307 |
| 2007/0262336 A1 | 11/2007 | Tamaki et al. | |
| 2008/0025021 A1* | 1/2008 | Engel | 362/247 |
| 2008/0041625 A1 | 2/2008 | Cheong et al. | |
| 2008/0055900 A1* | 3/2008 | Budike, Jr. | 362/235 |
| 2008/0116551 A1* | 5/2008 | Ferstl et al. | 257/678 |
| 2008/0210964 A1 | 9/2008 | Tomioka | |
| 2009/0218584 A1* | 9/2009 | Bogner | 257/98 |
| 2009/0231856 A1* | 9/2009 | Householder et al. | 362/304 |
| 2010/0032702 A1* | 2/2010 | Lahijani | 257/98 |
| 2010/0220461 A1* | 9/2010 | Naijo | 362/97.1 |
| 2010/0220474 A1* | 9/2010 | Park | 362/231 |

FOREIGN PATENT DOCUMENTS

| | | |
|---|---|---|
| DE | 11 2006 000 694 T5 | 2/2008 |
| WO | WO 2010/017790 A1 | 2/2010 |

* cited by examiner

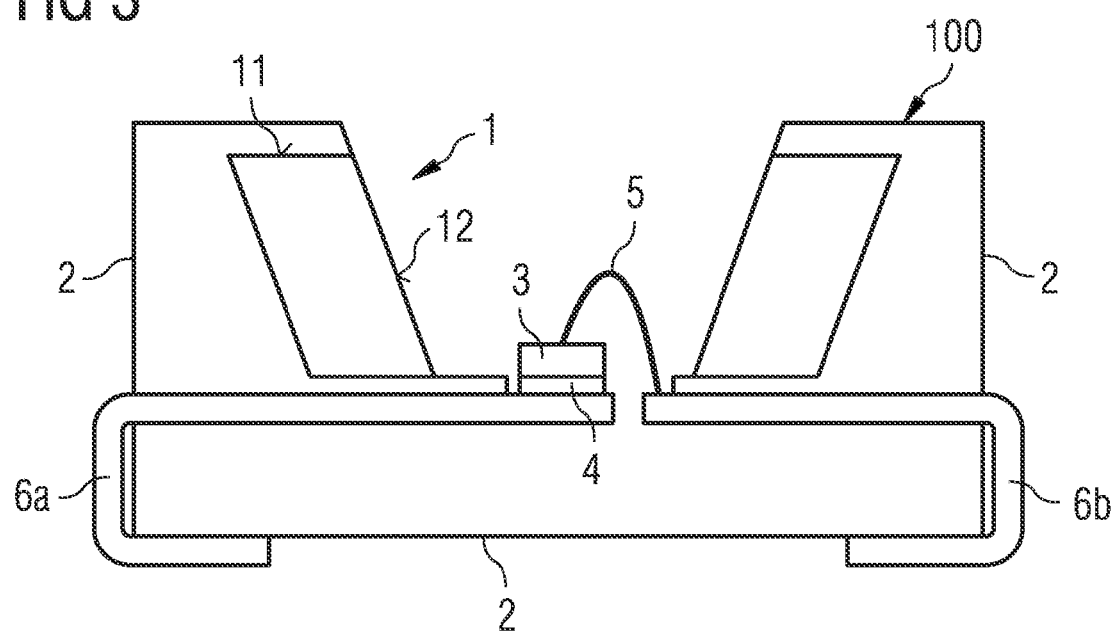

though filed on July 14, 2011 as WO 2011/082876, which

HOUSING THAT INCLUDES REFLECTOR PART AND HOUSING MATERIAL FORMED WITH PLASTIC MATERIAL

This patent application is a national phase filing under section 371 of PCT/EP2010/067705, filed Nov. 17, 2010 (published on Jul. 14, 2011 as WO 2011/082876), which claims the priority of German patent application 10 2009 058 421.8, filed Dec. 16, 2009, each of which is incorporated herein by reference in its entirety.

BACKGROUND

U.S. Pat. No. 6,624,491 describes a housing for an optoelectronic semiconductor device.

SUMMARY OF THE INVENTION

In one aspect, the invention discloses a method for producing a housing for an optoelectronic semiconductor device which results in a particularly aging stable housing for an optoelectronic semiconductor device.

A method for producing a housing for an optoelectronic semiconductor device is specified. The optoelectronic semiconductor device is, for example, a light emitting diode, a semiconductor laser or a photodetector.

In accordance with at least one embodiment of the method, the method comprises a method step in which a reflector part of the housing is provided. That is to say that the reflector part is prefabricated and is not produced together with other components of the housing.

The reflector part is provided for reflecting electromagnetic radiation generated in the semiconductor device or electromagnetic radiation received by the semiconductor device. That is to say that, during the operation of the semiconductor device, the reflector part reflects electromagnetic radiation impinging on a surface of the reflector part. For this purpose, the reflector part has at least one inner area suitable for reflecting electromagnetic radiation. The electromagnetic radiation is then, for example, electromagnetic radiation having a wavelength from the spectral range of UV radiation to the spectral range of infrared radiation. The reflector part is formed in a ring like manner in cross section, for example. In this case, "in a ring like manner" does not mean that the reflector part has to be embodied as a circular ring in cross section; rather, it is possible for the reflector part to have a circular, oval or rectangular basic shape. In the finished optoelectronic semiconductor device, the reflector part surrounds, for example, an optoelectronic semiconductor component of the semiconductor device—such as a light emitting diode chip for instance—in a frame like manner.

The reflector part has at least one inner area facing the opening of the ring like reflector part. In the finished optoelectronic semiconductor device, the at least one inner area faces, for example, an optoelectronic semiconductor component of the semiconductor device—such as a light emitting diode chip for instance.

In accordance with at least one embodiment of the method, the method comprises a method step in which the reflector part is enveloped with a housing material. In this case, the reflector part is preferably only enveloped in places, such that, for example parts of the at least one inner area or the entire inner area of the reflector part remain(s) free of the housing material. During the enveloping step, the housing material is brought into direct contact with the reflector part in places, a mechanically fixed connection between the reflector part and the housing material being formed. Separation of reflector part and housing material is then no longer possible in a non-destructive manner, that is to say that the connection between reflector part and housing material can be separated again only by destroying one or both of the components.

In this case, the reflector part is provided before the enveloping step. This means, in particular, that the reflector part is a prefabricated component of the housing which is produced separately in upstream production steps. The reflector part is therefore a self-supporting, mechanically stable component of the housing.

Alternatively, it is also possible for the reflector part to be present in the form of a film which, after the production of a housing basic body composed of the housing material, is pressed onto the housing basic body.

In accordance with at least one embodiment of the method, the enveloping of the reflector part with the housing material is produced by means of an injection molding method. That is to say that the reflector part produced separately from the rest of the housing is inserted into an injection mold and enveloped with the housing material by injection molding. In this case, the inner area of the reflector part preferably remains free of housing material at least in places.

In accordance with at least one embodiment of the method, the reflector part is formed with a first plastic material and the housing material is formed with a second plastic material. In this case, it is possible for the reflector part to consist of the first plastic material, or for the first plastic material to serve as matrix material for further admixtures and fillers. The housing material, too, can consist of the second plastic material or serve as matrix material for further admixtures and fillers. In this case, the first and second plastic materials differ from one another, wherein the first and second plastic materials preferably differ from one another with regard to at least one of the following material properties: thermal stability, resistance to electromagnetic radiation.

In this case, thermal stability is understood to mean the following, in particular: the plastic material having the higher thermal stability is distinguished, in particular, by the fact that it is discolored, deformed or destroyed only starting from a higher limit temperature than the plastic material having the lower thermal stability. Alternatively or additionally, the plastic material having the higher thermal stability can withstand deformation, discoloration or destruction for a longer time at a given temperature than the material having the lower thermal stability.

Resistance to electromagnetic radiation is understood to mean the following, in particular: the material having the higher resistance to electromagnetic radiation is deformed or discolored later than the plastic material having the lower resistance to electromagnetic radiation if both plastic materials are exposed to the same irradiation by electromagnetic radiation. The electromagnetic radiation is, for example, electromagnetic radiation from the wavelength range of UV radiation or blue light. In particular a discoloration of the plastic material having greater resistance to electromagnetic radiation then occurs in a delayed fashion in comparison with a material having lower resistance to electromagnetic radiation.

In accordance with at least one embodiment of the method, the method comprises the following steps: providing a reflector part, which has at least one inner area adapted for reflecting electromagnetic radiation, and enveloping the reflector part in places with a housing material.

In this case, the enveloping is effected by means of an injection molding method, the inner area of the reflector part remains free of the housing material at least in places, the reflector part is formed with a first plastic material, the housing material is formed with a second plastic material, the first plastic material is different than the second plastic material, the first plastic material and the second plastic material differ from one another with regard to at least one of the following material properties: thermal stability, resistance to electromagnetic radiation.

In this case, the method is based on the insight, inter alia, that cost effective basic substances are often subjected to aging in optoelectronic semiconductor devices, which is the result of the stressing of the material by heat and/or electromagnetic radiation. Particularly in the case of aging of optical components of the housing—such as, for example, a reflector part—this can greatly shorten the lifetime of the optoelectronic semiconductor device. In the present case, reflector part and housing material are now produced separately from one another, as a result of which the choice of materials for the components of the housing is simplified and it is possible to combine plastic materials with one another which would be too expensive for solely forming the entire housing or do not meet the requirements in respect of thermal stability and/or resistance to electromagnetic radiation.

Furthermore, a housing for an optoelectronic semiconductor device is specified. The housing can be produced by means of a method described here. That is to say that all of the features disclosed for the method are also disclosed for the housing, and vice versa.

In accordance with at least one embodiment of the housing, the housing comprises a reflector part, which has at least one inner area suitable for reflecting electromagnetic radiation. Furthermore, the housing comprises a housing material, which is in direct contact with the surface of the reflector part at least in places, wherein reflector part and housing material are mechanically connected to one another in a manner free of connecting means. That is to say that the housing material is not connected to the reflector part by means of an adhesive or a macroscopic mechanical connection such as a press fit, for instance; rather, the housing material is in direct contact with the surface of the reflector part and forms an intimate connection with the material of the reflector part.

By way of example, in this case the housing material can be mechanically connected to the reflector part by means of an injection molding method. The feature "injection molding method" is a feature related to the device since the connection by means of an injection molding method can be demonstrated on the finished device in a manner distinguishable from other connection techniques by virtue of typical traces of the method, such as a potting seam or the separation of an injection molding nozzle. That is to say that the device has traces of an injection molding method.

In accordance with at least one embodiment of the housing, the inner area of the reflector part is in this case free of housing material at least in places. The inner area of the reflector part is the optically active component of the reflector part, which reflects electromagnetic radiation impinging on it. By way of example, it is possible for the entire inner area of the reflector part to be free of housing material.

In accordance with at least one embodiment of the housing, the reflector part is formed with a first plastic material and the housing material is formed with a second plastic material, wherein the first plastic material is different than the second plastic material, and the first plastic material and the second plastic material differ from one another with regard to at least one of the following material properties: thermal stability, resistance to electromagnetic radiation.

In accordance with at least one embodiment of the housing for an optoelectronic semiconductor device, the housing comprises a reflector part, which has at least one inner area suitable for reflecting the electromagnetic radiation, and the housing furthermore comprises a housing material, which is in direct contact with the surface of the reflector part at least in places. In this case, the reflector part and the housing material are mechanically connected to one another in a manner free of connecting means, the inner area of the reflector part is free of housing material at least in places, the reflector part is formed with a first plastic material and the housing material is formed with a second plastic material, wherein the first plastic material is different than the second plastic material, and the first plastic material and the second plastic material differ from one another with regard to at least one of the following material properties: thermal stability, resistance to electromagnetic radiation.

Embodiments of the housing and of the method for producing the housing are described below, which relate in each case both to the method and to the housing.

In accordance with at least one embodiment, the housing material terminates flush with the reflector part at a top side of the housing or the housing material projects beyond the reflector part at the top side of the housing. In particular, the reflector part then does not project beyond the housing material.

In accordance with at least one embodiment, the reflector part is mechanically connected to the housing material exclusively by means of an injection molding method. In this case, reflector part and housing material directly adjoin one another.

In particular, it is possible for the reflector part to be in direct contact exclusively with the housing material. The reflector part then does not touch other components of the housing such as, for instance, a baseplate or connection locations. In this way, it is possible for the housing material and reflector part to have a particularly large area of contact with one another.

In accordance with at least one embodiment, before the step of providing the reflector part, the reflector part is produced by machining. In this case, machining or chipping denotes a method wherein a material is brought into a desired form, in which superfluous material is removed in the form of chips. In this case, machining is also a feature related to the reflector part that can be distinguished from other production methods such as injection molding, for example, on the finished article. A reflector part whose first plastic material is a fluoropolymer such as polytetrafluroethylene (PTFE), for example, is particularly suited to machining.

Alternatively, it is possible for the reflector part to be produced by film peeling. This is the case if the reflector part is a film.

In accordance with at least one embodiment, the reflector part, before it is provided, is produced by an injection molding method. A first plastic material which contains at least one of the following plastics or consists of one of the following plastics: polybutylene terephthalate (PBT), polyethylene terephthalate (PET), polycyclohexylene dimethylene terephthalate (PCT), polyetherimide (PEI), liquid crystal polymer (LCP), high temperature polyamides (HT PA), polyether ketones (PEEK), silicone, is particularly well suited to this.

That is to say that, in accordance with a first embodiment, the first plastic material is selected from a group comprising at least one of the following materials: polyester, fluoropolymer, polyether ketones, polyetherimide, high temperature polyamides, polyether ketones, liquid crystal polymer, silicone.

In accordance with at least one embodiment, the second plastic material is selected from a group comprising at least one of the following materials: polyamides, polyphenylene sulfide, polyetherimide, polyphenyl sulfone.

In this case, the first plastic material is distinguished, in particular, by resistance to electromagnetic radiation. In particular, the first plastic material is then more resistant to electromagnetic radiation than the second plastic material.

In this case, the first plastic material can also be more thermally stable than the second plastic material. If the optoelectronic device is provided, for example, for mounting by means of a soldering method, however, the second plastic material, with which the housing material is formed, is preferably chosen to be particularly thermally stable, such that the second plastic material can have a higher thermal stability than the first plastic material.

In accordance with at least one embodiment, the entire surface of the reflector part is covered with the housing material during the enveloping of the reflector part with the housing material apart from at least parts of the inner area. That is to say that the connecting area between reflector part and housing material is preferably chosen to be particularly large, without adversely influencing the optical properties of the reflector part. This enables a particularly good adhesion between reflector part and housing material.

The reflector part can additionally also have at least one mechanical anchoring structure such as an undercut, for example, which counteracts a possible detachment of the reflector part from the housing material.

In accordance with at least one embodiment, the housing material and the reflector part differ with regard to their optical properties. By way of example, the reflector part is embodied as reflective to electromagnetic radiation in the spectral range between UV radiation and infrared radiation. The reflector part can then have a reflectivity of at least 80%, preferably of at least 90%, for at least one wavelength from said spectral range. The housing material, by contrast, can be embodied as radiation opaque, for example colored, radiation absorbent, black or reflective to a lesser extent than the reflector part. In this case, the optical properties of housing material and reflector part can be achieved by corresponding admixtures into the first and the second plastic material, respectively.

In accordance with at least one embodiment, the reflector part comprises the first plastic material and a white pigment introduced into the plastic material. The white pigment is, for example, at least one of the following materials: titanium oxide, lithopone, barium sulfate, zinc oxide, zinc sulfide, zirconium dioxide, chalk. In addition to the white pigment, the first plastic material can contain further fillers, such as glass fibers, for example, which increase the mechanical stability of the reflector part.

Overall, it is thus possible to realize a housing in which the mechanical, optical and photochemical properties of the components of the housing are adapted to the respective conditions of use in a simple manner.

An optoelectronic device is furthermore specified. The optoelectronic device comprises a housing as described. That is to say that all of the features disclosed for the housing are also disclosed for the optoelectronic device. Furthermore, the optoelectronic device comprises at least one optoelectronic component such as, for example, a radiation emitting semiconductor chip. The radiation emitting semiconductor chip can be, for instance, a light emitting diode chip or a laser diode chip.

In this case, the at least one optoelectronic component is introduced into the housing in such a way that it is laterally surrounded by the at least one inner area of the reflector part. That is to say that a cutout is formed in the housing through the reflector part, said cutout being laterally delimited by the at least one inner area of the reflector part. The optoelectronic component is introduced into the cutout. Electromagnetic radiation generated by the optoelectronic component during operation can impinge on the at least one inner area of the reflector part and is reflected directionally or diffusely from the latter—depending on the embodiment of the inner area.

BRIEF DESCRIPTION OF THE DRAWINGS

The method described here, the housing described here and the device described here are explained in greater detail below on the basis of exemplary embodiments and the associated figures.

FIGS. 2A, 2B and 3 show, on the basis of schematic views, exemplary embodiments of devices described here with exemplary embodiments of housings described here.

Elements that are identical, of identical type or act identically are provided with the same reference symbols in the figures. The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

Figure 1A:
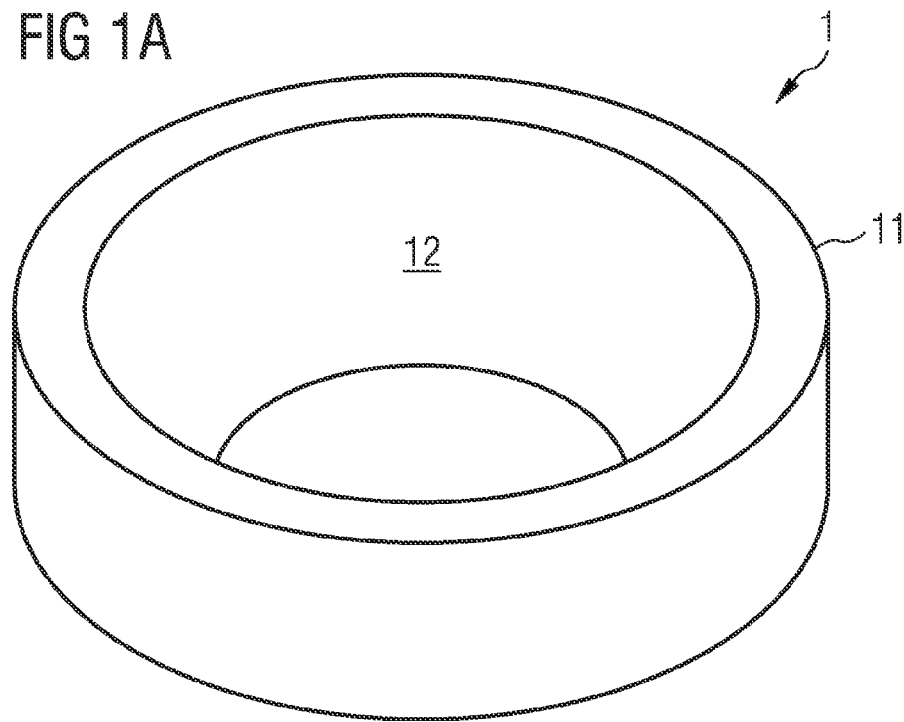
FIGS. 1A and 1B show, on the basis of schematic views, a reflector part for an exemplary embodiment of a housing described here.

FIG. 1A shows, in a schematic perspective illustration, a reflector part for an exemplary embodiment of a housing described here. The reflector part is illustrated in plan view in FIG. 1B. The reflector part 1 is embodied in a ring shaped fashion. The reflector part 1 has a surface 11 encompassing the inner area 12. The inner area 12 is embodied as reflective to electromagnetic radiation.

The reflector part 1 is formed from a first plastic material described here. White pigments are introduced into the plastic material in order to improve the radiation reflecting properties of the reflector part 1.

The reflector part 1 is produced, for example, by machining or by means of an injection molding method separately from the rest of the housing. The reflector part 1 is a rigid, mechanically self-supporting component of the housing. The component is mechanically fixedly connected to the remaining components of the housing by a production method described here.

Figure 2A:
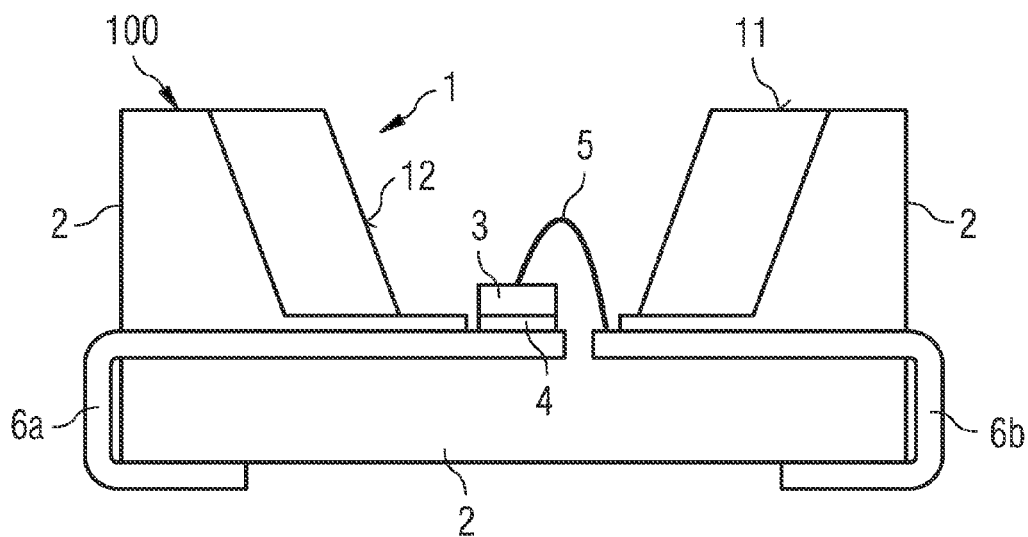
Figure 2B:
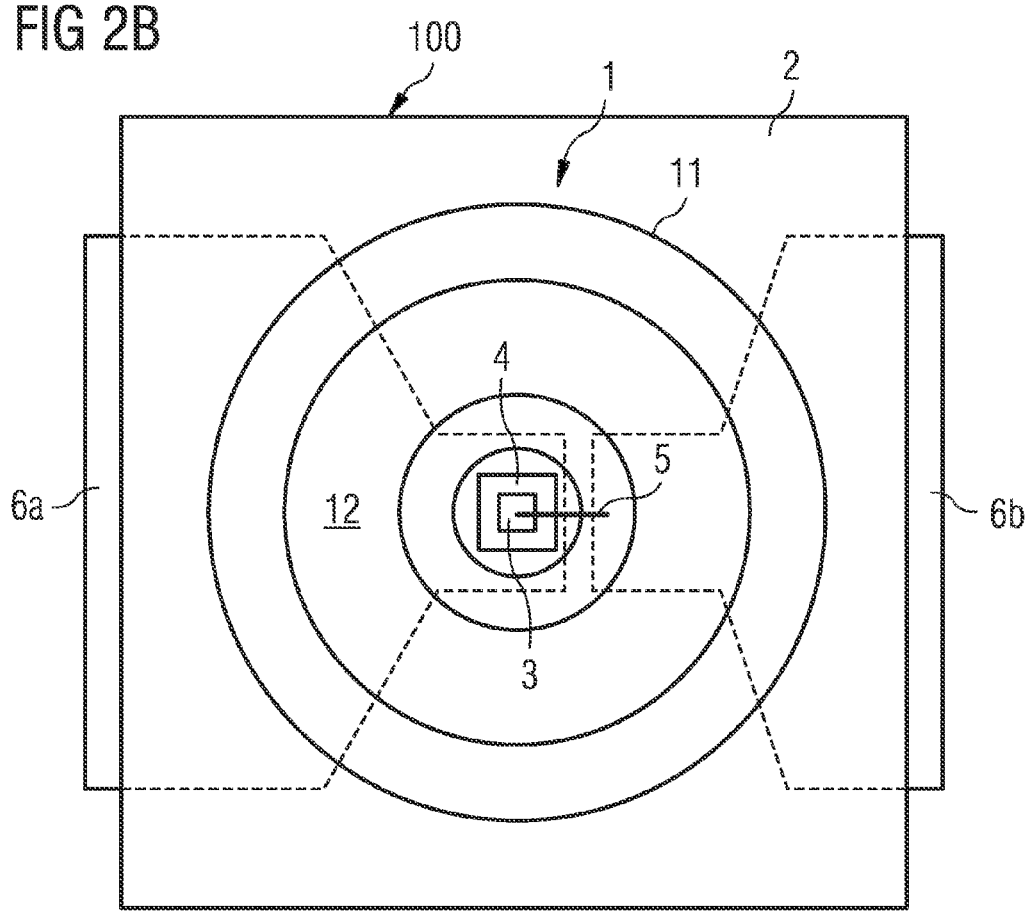

FIG. 2A shows a first exemplary embodiment of an optoelectronic semiconductor device described here with a housing 100 described here in a schematic sectional illustration; FIG. 2B shows the associated plan view.

Figure 1B:
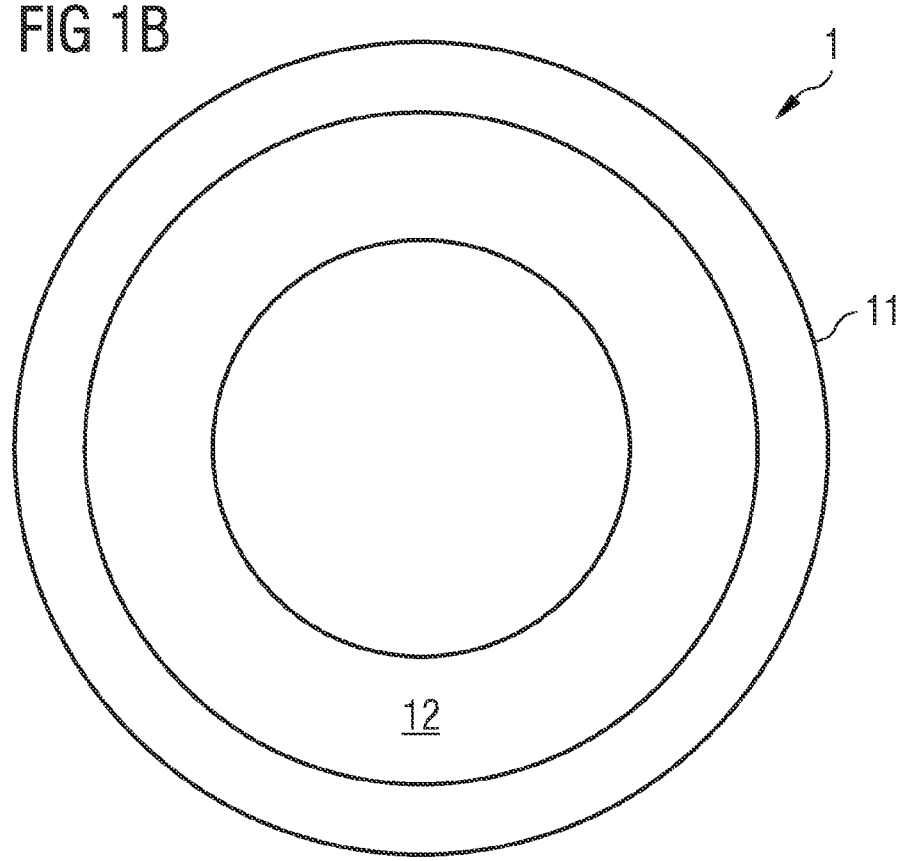

The housing 100 comprises a reflector part 1, as explained in greater detail for example in conjunction with FIGS. 1A and 1B. The reflector part 1 is in direct contact with the housing material 2 in places at its surface 11.

The housing material 2 is injection molded onto the reflector part 1 by means of an injection molding method and is therefore in direct contact with the reflector part 1 in places. That is to say that the housing material 2 is connected to the reflector part 1 in a manner free of connecting means (i.e., connecting device). In the present case, the entire inner area 12 of the reflector part 1 is free or substantially free of the housing material 2. Substantially free of the housing material 2 can mean, for example, that at most an area proportion of 10%, in particular examples at most 5%, of the inner area 12 of the reflector part 1 is covered with housing material 2.

The material for the reflector part 1 is chosen, for example, in such a way that its melting point is lower than the melting point of the housing material 2. By way of example, the melting point of the reflector part 1 is between at least 5° C. and at most 30° C. below the melting point of the housing material 2. This can ensure that, during the process of encapsulation by injection molding, the reflector part 1 momentarily softens and then adheres well to the housing material 2.

However, it is also possible for the melting point of the reflector part 1 to be greater than or equal to the melting point of the housing material 2. In this case, in particular, the outer area of the reflector part 1 facing the housing material 2 is embodied as rough or porous, such that the housing material 2 in the molten state can interlock in the roughening or pores of the reflector part 1.

The reflector part 1 forms a cutout in the housing 100, an optoelectronic semiconductor component 3, for example a radiation emitting semiconductor chip, being arranged in said cutout. The inner area 12 of the reflector part 1 surrounds the component 3 in a frame like manner.

The housing 100 furthermore comprises first and second connection locations 6a, 6b. The semiconductor component 3 is connected to the first connection location 6a via a connecting means, for example an electrically conductive adhesive or a solder material. The semiconductor component 3 is electrically conductively connected to the second connection location 6b via a contact wire 5. First and second connection locations 6a, 6b are preferably enveloped with the housing material 2 by injection molding in the same injection molding process as the reflector part 1 and are thereby mechanically connected thereto.

The housing material 2 is formed with a second plastic material, which comprises, for example, at least one of the following plastics: polyamides, polyphenylene sulfide, polyetherimide, polyphenyl sulfone.

Fillers for setting the optical properties and the mechanical stability such as carbon black, pigments and/or glass fibers, can be introduced into the second plastic material.

In the exemplary embodiment in FIGS. 2A, 2B, the surface 11 of the reflector part 1 is free of the housing material 2 at its top side facing away from the connection locations 6a, 6b.

In contrast thereto, in the exemplary embodiment in FIG. 3, the reflector part 1 is covered with the housing material 2 at said surface, too, and is in direct contact with said housing material. That is to say that, in this exemplary embodiment, only the inner area 12 of the reflector part 1 is free of the housing material 2. In this exemplary embodiment, the reflector part 1 is mechanically connected in a manner adhering particularly well to the housing material 2. By way of example, the outer area of the reflector part 1 which is in direct contact with the housing material 2 is roughened and/or porous and the roughenings and/or pores of the reflector part 1 are filled with the housing material 2 in at least in places.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for producing a housing for an optoelectronic semiconductor device, the method comprising:

providing a reflector part, which has an inner area configured to reflect electromagnetic radiation; and surrounding the reflector part in places with a housing material;

wherein the surrounding is performed using an injection-molding method;

wherein the inner area of the reflector part remains free of the housing material at least in places;

wherein the reflector part is formed with a first plastic material;

wherein the housing material is formed with a second plastic material;

wherein the first plastic material is different than the second plastic material;

wherein the first plastic material and the second plastic material differ from one another with regard to at least thermal stability or resistance to electromagnetic radiation; and wherein, before providing the reflector part, the method further comprises forming the reflector part by machining or by performing an injection-molding method.

2. The method according to claim 1, wherein forming the reflector part comprises forming the reflector part by machining.

3. The method according to claim 1, wherein forming the reflector part comprises performing an injection-molding method to form the reflector part.

4. The method according to claim 1, surrounding the reflector part comprises covering the entire surface of the reflector part with the housing material apart from parts of the inner area.

5. A housing for an optoelectronic semiconductor device, the housing comprising:

a reflector part that includes an inner area configured to reflect electromagnetic radiation; and a housing material in direct contact with a surface of the reflector part;

wherein the reflector part and the housing material are mechanically connected to one another in a manner free of any connecting device;

wherein the inner area of the reflector part is free of the housing material at least in places;

wherein the reflector part is formed with a first plastic material;

wherein the housing material is formed with a second plastic material;

wherein the first plastic material is different than the second plastic material;

wherein the first plastic material and the second plastic material differ from one another with regard to at least thermal stability or resistance to electromagnetic radiation; and wherein an outer area of the reflector part which is in direct contact with the housing material is roughened and/or porous and roughenings and/or pores of the reflector part are filled with the housing material at least in places.

6. The housing according to claim 5, wherein the reflector part and the housing material are mechanically connected to one another by an injection-molding method.

7. The housing according to claim 5, wherein the housing material and the reflector part differ from one another with regard to their optical properties.

8. The housing according to claim 5, wherein the reflector part has a reflectivity of at least 80% for a UV radiation and/or a visible radiation and/or an infrared radiation.

9. The housing according to claim 5, wherein the reflector part comprises the second plastic material and a white pigment.

10. The housing according to claim 9, wherein the white pigment comprises at least one materials selected from the group consisting of titanium dioxide, lithopone, barium sulfate, zinc oxide, zinc sulfide, zirconium dioxide, and chalk.

11. The housing according to claim 5, wherein the first plastic material comprises at least one material selected from the group consisting of polyester, fluoropolymer, polyether ketones, polyetherimide, high-temperature polyamides, polyether ketones, liquid crystal polymer, and silicone.

12. The housing according to claim 5, wherein the second plastic material comprises a material selected from the group consisting of polyamides, polyphenylene sulfide, polyetherimide, and polyphenyl sulfone.

13. The housing according to claim 5, wherein the first plastic material has a lower melting point than the second plastic material.

14. An optoelectronic device comprising:
the housing according to claim 5; and
an optoelectronic component that is laterally surrounded by the inner area of the reflector part.

15. The optoelectronic device according to claim 14, wherein the optoelectronic component comprises a radiation-emitting semiconductor chip.

16. The optoelectronic device according to claim 14, wherein the housing comprises a first electrical connection location and a second electrical connection location and the optoelectronic component is electrically conductively connected to the first and second connection locations.

17. The optoelectronic device according to claim 16, wherein the reflector part comprises a surface at its top side facing away from the first and the second electrical connection locations, the surface being free of the housing material.

18. The optoelectronic device according to claim 16, wherein the reflector part comprises a surface at its top side facing away from the first and the second electrical connection locations, said surface being covered with the housing material.

19. The optoelectronic device according to claim 18, wherein the surface facing away from the first and the second connection locations is in direct contact with the housing material.

20. A method for producing a housing for an optoelectronic semiconductor device, the method comprising:
forming a reflector part by machining, which has at least one inner area adapted for reflecting electromagnetic radiation; and
performing an injection-molding method to surround the reflector part in places with a housing material;
wherein the inner area of the reflector part remains free of the housing material at least in places;
wherein the reflector part is formed with a first plastic material;
wherein the housing material is formed with a second plastic material;
wherein the first plastic material is different than the second plastic material;
wherein the first plastic material and the second plastic material differ from one another with regard to at least thermal stability or resistance to electromagnetic radiation; and
wherein the first plastic material comprises a fluoropolymer.

* * * * *